United States Patent [19]
Barrenscheen et al.

[11] Patent Number: 6,147,635
[45] Date of Patent: Nov. 14, 2000

[54] TIMER FOR A/D CONVERTER

[75] Inventors: Jens Barrenscheen, München; Peter Rohm, Pfaffenhofen; Gunther Fenzl, Höhenkirchen-Siegertsbrunn, all of Germany

[73] Assignee: Siemens Aktiengesellschaft, Munich, Germany

[21] Appl. No.: 09/307,999

[22] Filed: May 10, 1999

[30] Foreign Application Priority Data

May 8, 1998 [DE] Germany .......................... 198 20 735

[51] Int. Cl.⁷ ................................................. H03M 1/12
[52] U.S. Cl. .......................................................... 341/155
[58] Field of Search .................................. 341/155, 144, 341/157, 164, 165

[56] References Cited

U.S. PATENT DOCUMENTS 4,796,006  1/1989  Murray et al. ........................... 341/144
5,355,136  10/1994 Katagiri et al. ......................... 341/157

FOREIGN PATENT DOCUMENTS

3726582C2  6/1995  Germany .

*Primary Examiner*—Brian Young
*Attorney, Agent, or Firm*—Herbert L. Lerner; Laurence A. Greenberg; Warner H. Stemer

[57] ABSTRACT

A timer for an A/D converter generates a request signal for A/D conversion by the A/D converter. In addition to the usual request signal, the timer produces a further signal which is used, before one cycle of the timer has elapsed, to block the A/D converter for low-priority requests from other requesting devices and to reserve it for the timer. In this manner, the signal to be converted from the timer can be sampled at reproducible, equidistant instants without having to wait for the end of the last conversion.

12 Claims, 4 Drawing Sheets

TIMER FOR A/D CONVERTER

BACKGROUND OF THE INVENTION

FIELD OF THE INVENTION

The invention lies in the electronics field. Specifically, the invention pertains to a timer for an A/D converter having means for producing a request signal in order to produce a first request signal for the A/D converter to perform A/D conversion on an analog signal allocated to the timer during a defined time interval which is repeated cyclically.

In complex applications, various analog input signals have to be supplied to the A/D converter and converted at previously programmed times or in response to various events. The input signals to be converted can originate from different converter request sources which, in turn, are allocated a multiplicity of different signal channels. The request sources produce request signals for the A/D converter, in order in this way to request A/D conversion for a specific one of their signal channels from the A/D converter.

One of these request sources can be a programmable timer unit which, under clock control, produces request signals for the A/D converter. In particular, these timer units enable A/D conversions to be triggered cyclically. In this instance, the requests from the timer unit are synchronized with the other request sources using so-called interrupts, a so-called interrupt flag generally being set after every conversion. However, since the individual modules require a specific reaction time to respond to interrupt flags that have been set, exact synchronization of the different request sources is not always guaranteed.

Furthermore, when connecting a timer to an A/D converter which samples, i.e. equidistantly detects and converts, analog input signals, it is necessary to make sure that the A/D converter is not actively converting at an instant where the timer is requesting a new conversion. For some applications, such synchronization is very important.

SUMMARY OF THE INVENTION

It is accordingly an object of the invention to provide a timer for an A/D converter which overcomes the above-mentioned disadvantages of the heretofore-known devices and methods of this general type and which allows for time-synchronized processing of its request signals.

With the foregoing and other objects in view there is provided, in accordance with the invention, a timer for an A/D converter, comprising:
- a request device adapted to produce a first request signal for an A/D converter to perform A/D conversion on an analog signal allocated to the timer during a cyclically repeated, defined time interval;
- the request device further producing a second request signal, from a specific instant before the defined time interval has elapsed and up to an end of the defined time interval $T_G$, the second request signal to be evaluated in combination with the first request signal for A/D conversion by the A/D converter.

In summarizing the present invention, an additional signal is produced with the actual request signal from the timer. The additional signal, together with the actual request signal from the timer, is to be evaluated in combination as a request signal from the timer for A/D conversion by the A/D converter. The additional signal is produced, in particular, during a programmable time interval which is chosen to be at least as long as the conversion time required by the A/D converter for converting a sample of an analog signal.

The additional signal can be used to block the A/D converter for other, low-priority conversions and requests from other request sources, and hence to reserve it for the timer. In this manner, it is possible both for an A/D conversion to be requested for an analog signal from the timer and for this analog signal to be sampled at reproducible, equidistant instants without having to wait for the end of the last conversion. Special, direct coupling of the timer to other modules or request sources can be maintained without the need for interrupts to transmit requests.

The following refinements of the timer assembly according to the invention help render the novel circuit as simple as possible and to achieve an improvement in synchronization.

In accordance with an added feature of the invention, the request device comprises a timer register having a content being decremented in steps from a defined initialization value to a defined minimum value during the cyclically repeating, defined time interval, and the request device further comprising a comparator for monitoring a content of the timer register and initiating a generation of the second request signal when the content of the timer register falls below a defined threshold.

In accordance with an additional feature of the invention, the request device comprises a programmable threshold register coupled to the comparator and having a content defining the defined threshold and a defined instant for generating the second request signal.

In accordance with another feature of the invention, a plurality of channels are allocated to the timer, the channels each providing an analog signal for the A/D converter, and the request device further comprising a trigger register with control bits allocated to individual the channels, and wherein a trigger pulse is applied to the trigger register if the content of the timer register has reached the defined minimum value, and an application of the trigger pulse setting a defined control bit of the trigger register, whereupon the channel corresponding to the set control bit is selected for A/D conversion by the A/D converter.

In accordance with a further feature of the invention, the request device includes an OR circuit receiving the states of the control bits of the trigger register as input signals and outputting the first starting signal as an output signal.

In accordance with again an added feature of the invention, the request device also includes a further register wherein the comparator sets a control bit determining a state of the second request signal, and a further OR circuit having an input receiving a state of the control bit, driven by the comparator, of the further register and the first request signal, and an output outputting a signal to be evaluated for A/D conversion by the A/D converter.

In accordance with again an additional feature of the invention, the request device comprises initialization means for reloading the timer register with the defined initialization value and deleting the control bit, set by the comparator, of the further register if the content of the timer register has fallen to the defined minimum value.

In accordance with again another feature of the invention, control means are connected to the output of the further OR circuit, the timer is one of a plurality of requesting devices for the A/D converter, the requesting devices producing request signals for A/D conversion of an analog signal allocated to the respective the requesting device, and wherein the further OR circuit outputs an output signal to the control means and the control means, depending on the request signals from the individual requesting devices, selects a respective the requesting device for A/D conversion by the A/D converter.

In accordance with again a further feature of the invention, each requesting device is allocated a defined priority, and the control means, when request signals from different requesting devices are simultaneously present, selecting a requesting device for A/D conversion by the A/D converter with a highest priority.

In accordance with a concomitant feature of the invention, the timer is allocated the highest priority.

Other features which are considered as characteristic for the invention are set forth in the appended claims.

Although the invention is illustrated and described herein as embodied in timer for an A/D converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
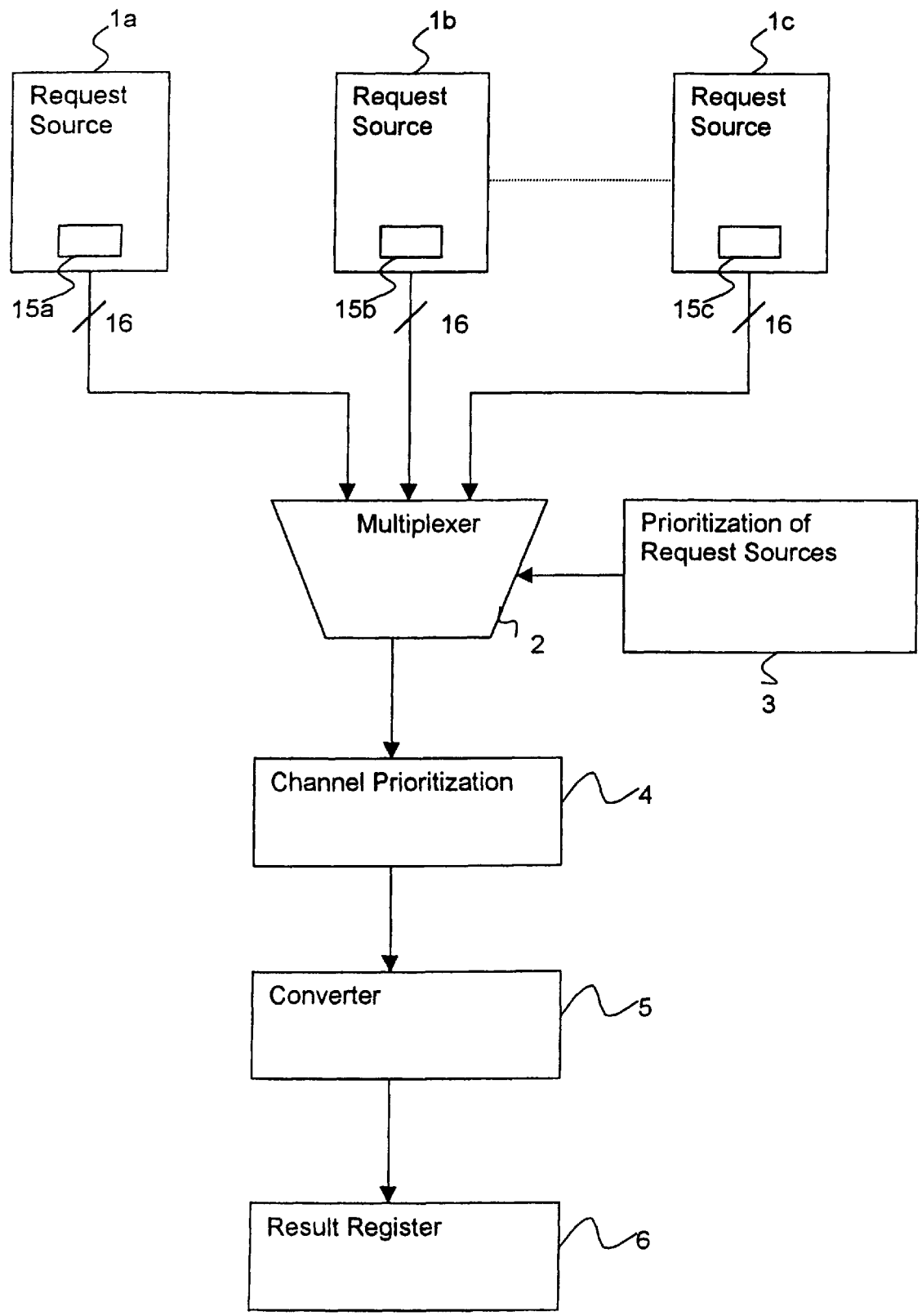
FIG. 1 is a simplified block diagram of an A/D converter configuration which uses a timer according to the present invention.

Referring now to the figures of the drawing in detail and first, particularly, to FIG. 1 thereof, there is seen an A/D converter configuration which includes, as central element, an A/D converter 5. The A/D converter 5 has the task of sampling an analog input signal, which is fed to it, at defined instants and converting the sampled analog input signal into a digital output signal. The digital samples are stored in a result register 6 for further processing.

The analog input signal fed to the A/D converter 5 can originate from different signal channels which, in turn, can be allocated to different converter request sources or converter requesting devices 1a–1c. One of these request sources can be a timer 1b, for example. By contrast, the request sources 1a and 1c, which are also shown in FIG. 1, can be devices which produce request signals for the A/D converter 5 depending on an external event or under software control, in order in this way to request A/D conversion for one of their signal channels. Furthermore, these request sources may be controllers which, in the form of an "Auto-Scan" controller or a queue controller, produce request signals for the signal channels respectively allocated to them etc. Each of these request sources 1a–1c is allocated a register 15a–15c in which a respective control flag is set if a request for A/D conversion by the A/D converter 5 is made by the corresponding request source for one of the signal channels allocated to the respective request source. A multiplexer 2 connected between the request sources 1a–1c and the A/D converter 5 has the task of selecting one of the request sources 1a–1c and feeding the selected request source's signal channel that is to be converted to the A/D converter. According to the exemplary embodiment shown in FIG. 1, each request source 1a–1c is allocated 16 signal channels, so that the request sources 1a–1c are each connected to the multiplexer 2 via 16 signal lines.

Since a number of requests from different request sources may possibly be made at the same time, i.e. a number of the control flags 15a–15c can be set at the same time, then, in the A/D converter arrangement shown in FIG. 1, that request from the individual request sources 1a–1c that is to be processed is selected on the basis of specific priority control. To do this, each of the request sources 1a–1c is allocated a defined priority, where each request source 1a–1c, in particular, has an individual priority. A prioritization or arbitration logic unit 3 monitors the status of the control flags 15a–15c for the individual request sources 1a–1c and, if a number of these control flags 15a–15c are in use at the same time, i.e. if request signals from different request sources are present at the same time, determines the request source that is allocated the highest priority. On the basis of that prioritization, the multiplexer 2 can be driven to select the request source with the highest priority. If a request has been made by only one request source 1a–1c, this is automatically connected to the A/D converter 5 by the multiplexer 2.

Since the request source selected by the prioritization logic unit 3 can be allocated to a number of signal channels, it is subsequently also necessary to determine which signal channel of this request source is actually intended to be converted by the A/D converter 5. To do this, a channel prioritization logic unit 4 is provided which—as will be explained later with reference to FIG. 4—selects, for example using register entries for the selected request source 1a–1c, the respective request source's signal channel that is to be processed and feeds it to the A/D converter 5.

As already explained above, the request source 1b may be in the form of a programmable timer unit, for example, which, under temporal control, cyclically produces request signals for A/D conversions for the signal channels allocated to it. When connecting such a timer to the A/D converter 5, it is necessary to make sure that, when the analog signals from the timer are being sampled, the A/D converter 5 is not actively converting at an instant where the timer is requesting a new conversion. To this end, the present invention provides for the timer 1b to comprise means which enable jitter-free sampling and A/D conversion of analog signals allocated to the timer 1b. This will be explained in more detail below with reference to FIGS. 2–4.

Figure 2:
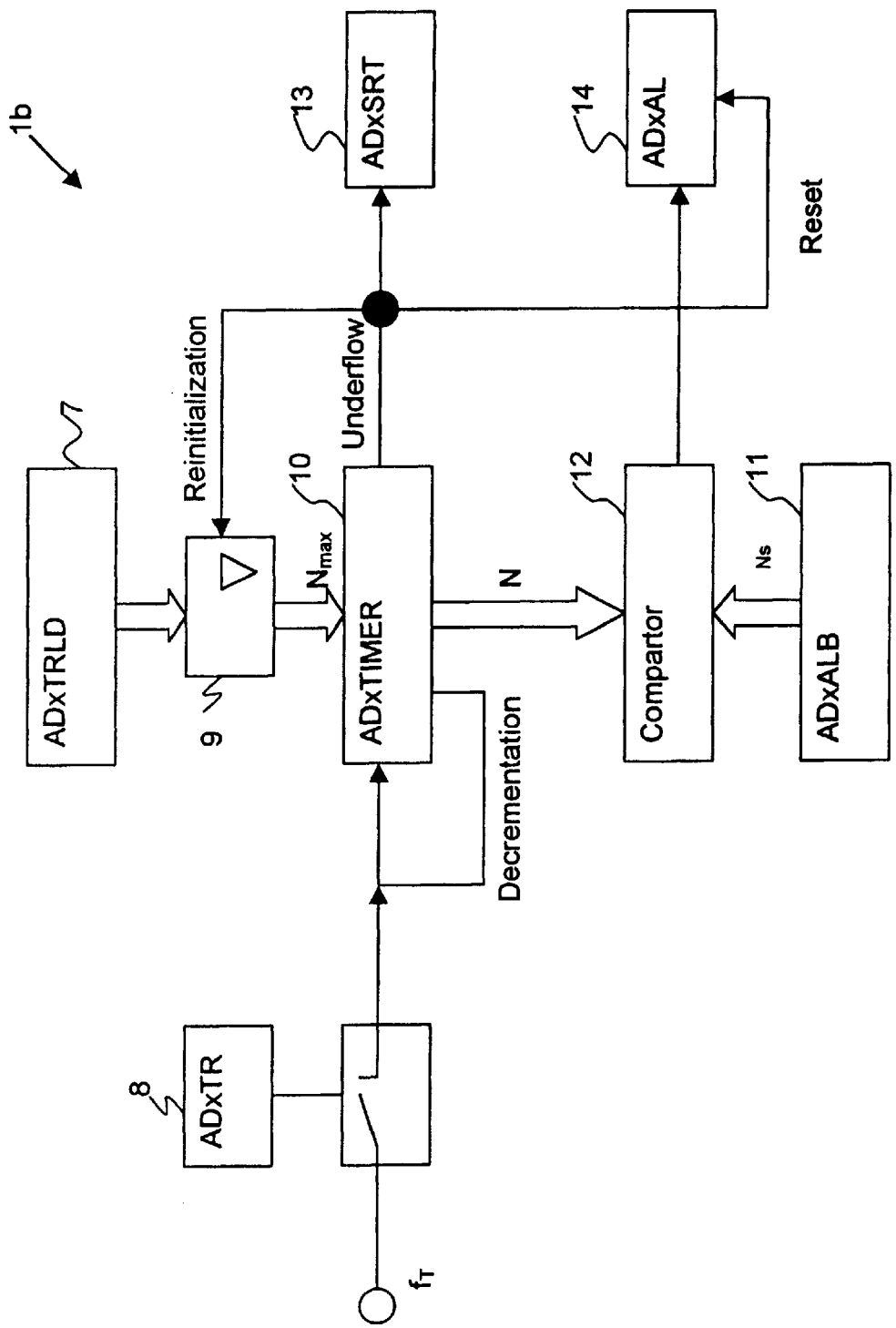
FIG. 2 is a simplified block diagram of a first section of a preferred exemplary embodiment of the timer according to the invention.

FIG. 2 shows a simplified block diagram of a major section of the timer 1b shown in FIG. 1 in accordance with a preferred exemplary embodiment of the present invention.

A major component of the section shown in FIG. 2 is a register 10, which represents the actual timer register ADxTIMER. By setting a start bit ADxTR stored in a further register 8, the timer register 10 is supplied with a defined timer clock having the frequency $f_T$. The timer clock $f_T$ corresponds to the clock used to operate the prioritization logic unit 3 shown in FIG. 1, and is derived from a peripheral clock signal. By setting the start bit ADxTR, the timer register 10 is loaded with an initialization value defined in a bit field ADxTRLD of an initialization register 7. This initialization value corresponds to an initial counter reading $N_{max}$ of the timer register 10, which is decreased in steps, i.e. decremented, depending on the clock signal $f_T$. The counter reading of the timer register 10 is decremented until an underflow occurs in the timer register 10. If an underflow is established in the timer register 10, the timer register 10 is reinitialized, a device 9 being used to reload the timer register 10 with the initialization or starting value defined in the bit field ADxTRLD.

According to the preferred exemplary embodiment of the timer 1b according to the invention, shown in FIG. 2, the timer produces not only request signals for A/D conversion by the A/D converter 5 shown in FIG. 1, but the timer 1b is also used for producing defined service inquiries which are to be evaluated by corresponding service devices for the respective application. For this purpose, a corresponding register 13 is provided in which a control flag ADxSRT is set if there is an underflow in the timer register 10, in order in this way to initiate a corresponding service inquiry. The service function can generally be configured in an application-specific manner and can be activated and deactivated.

To enable jitter-free sampling and A/D conversion of analog signals allocated to the timer, a further register 11 is provided in which a defined threshold or limit value $N_s$ is defined in the form of a bit field ADxALB, said value $N_s$ being supplied to a comparator 12. The register 11 can be freely programmed to match the threshold $N_s$ to the respective requirements. The comparator 12 compares the instantaneous counter reading N or content of the timer register 10 with the threshold $N_s$ predetermined by the register 11. As soon as the comparator 12 recognizes that the content of the timer register 10 has reached the predetermined threshold $N_s$ or has fallen below it, a control bit ADxAL is set in a further control register 14. As explained in more detail below, the set control flag ADxAL causes an additional signal to be produced independently of the actual request signal from the timer 1b, in order, by combining this additional signal with the actual request signal from the timer 1b, to block the A/D converter 5, shown in FIG. 1, for a programmable time interval, corresponding to the threshold $N_s$, for other conversion inquiries from low-priority request sources and hence to reserve it for the timer 1b artificially. The control flag ADxAL set in the control register 14 is in each case reset, i.e. deleted, if an underflow is established in the timer register 10.

Figure 3:
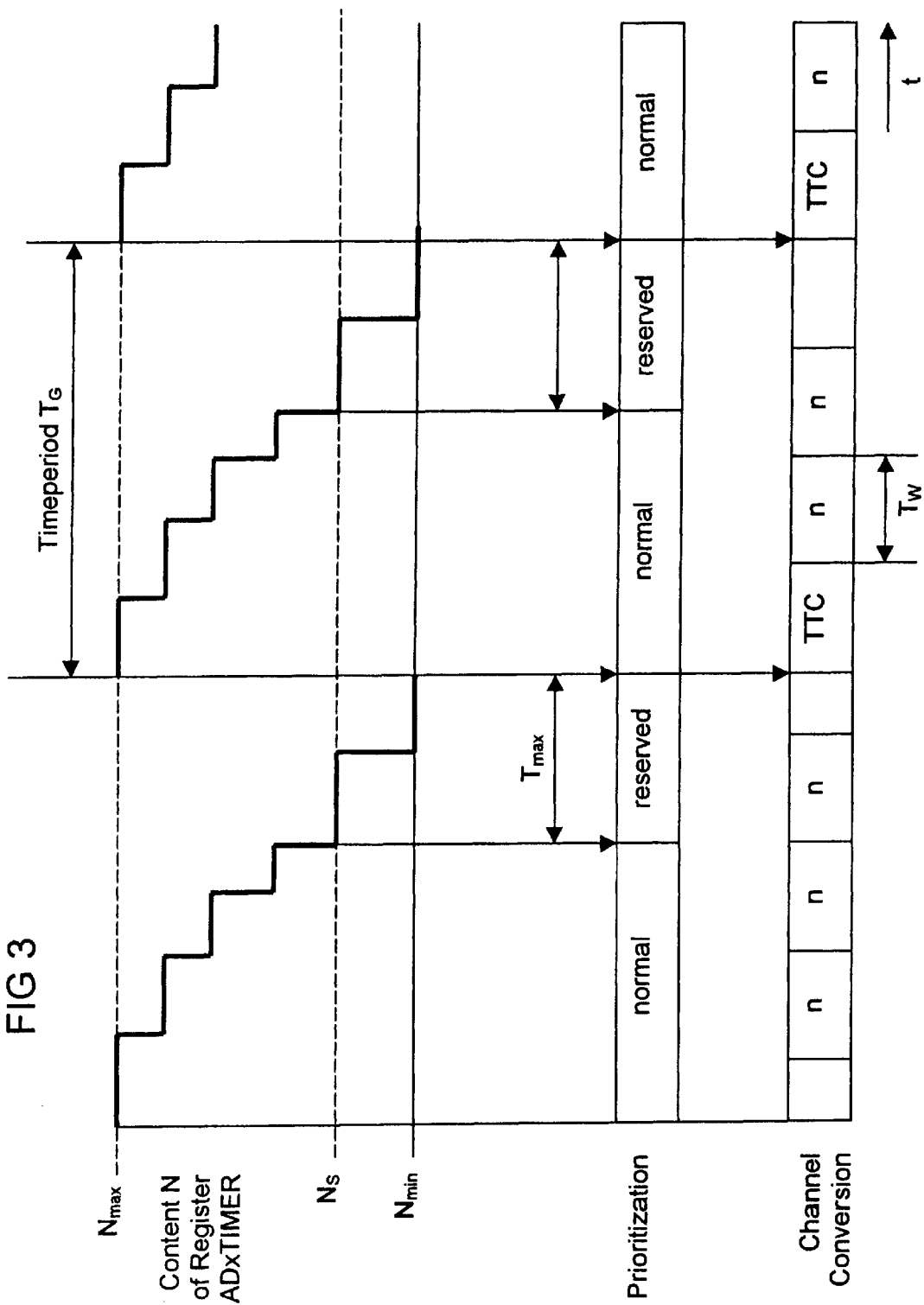
FIG. 3 is a graph explaining the section of the timer according to the invention shown in FIG. 2.

The operation of the circuit section shown in FIG. 2 is best understood with detailed reference to the timing graph shown in FIG. 3.

The upper region of the graph shown in FIG. 3 illustrates the profile for the counter reading N of the timer register 10 (ADxTIMER). Starting from the initialization or starting value $N_{max}$, the timer register 10 is decremented in steps in accordance with the clock frequency $f_T$ over a timer cycle $T_G$. The reinitialization explained with reference to FIG. 2 is carried out if an underflow is established in the timer register 10, i.e. if a minimum counter reading $N_{min}$ is reached, as a result of which the starting value $N_{max}$ defined in the register 7 is reloaded into the timer register 10, so that it is possible for the timer content to be decremented again over the next timer cycle $T_G$. The timer cycle $T_G$ can be between a few $\mu$s and a few ms and is defined such that timer-based initiation of service requests and A/D converter requests for the signal channels allocated to the timer is possible. As explained in more detail below, an underflow in the timer register 10 causes not only the timer register 10 to be reinitialized and the control flag ADxSRT in the control register 13 (cf. FIG. 2) to be set, but also causes a new trigger pulse to be produced for the request signal output in a known manner by the timer 1b.

Figure 4:
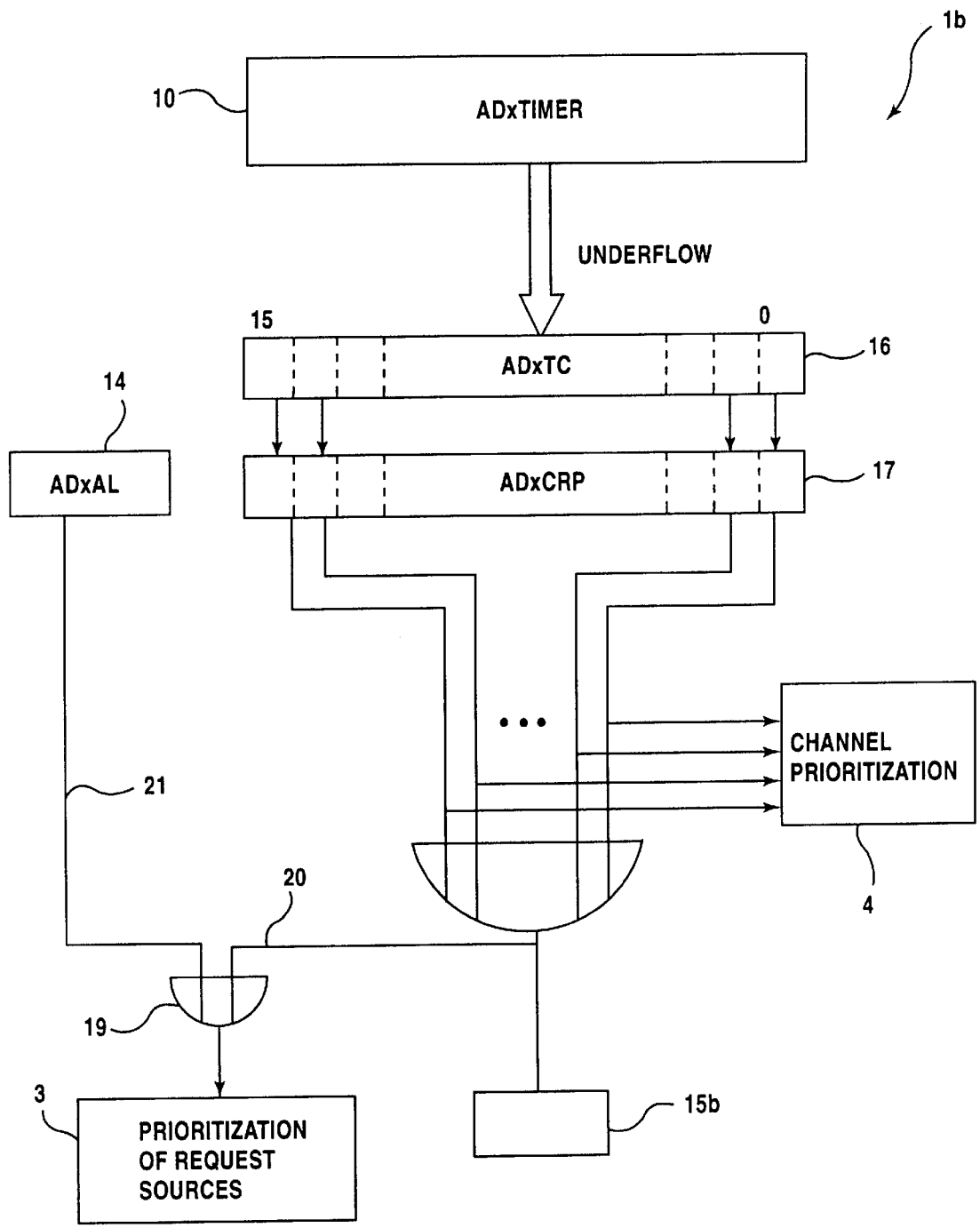
FIG. 4 is a simplified block diagram of a second section of the preferred exemplary embodiment of the timer according to the invention.

FIG. 4 shows a block diagram of a further section of the timer 1b according to the preferred exemplary embodiment of the present invention, which will be used to explain the production of the customary request signal by the timer 1b for the A/D converter 5 (cf. FIG. 1).

As can be seen in FIG. 4, the timer 1b comprises a trigger control register 16 which, together with a further register 17, is used for producing a trigger pulse for a new request signal from the timer 1b. The trigger control register (ADxTTC) comprises 16 control bits each allocated to a signal channel of the timer. Setting one control bit of this register 16 enables that signal channel of the timer 1b that corresponds to the respective control bit to be triggered.

When an appropriate trigger pulse is produced, a corresponding flag is set in a further register 17, this register 17 (ADxTCRP) indicating those signal channels for which there is currently a conversion request. In this way, conversion requests from a number of signal channels can be triggered at the same time. The flags set in the register 17 in accordance with the configuration of the trigger control register 16 when there is an underflow in the timer register 10 are linked to one another by means of a logic OR circuit 18, the output signal from the OR circuit corresponding to the status of the control flag stored in the register 15b, which control flag—as already explained with reference to FIG. 1—is evaluated by the prioritization logic unit 3, which is likewise shown in FIG. 1. ORing the control flag of the register 17 guarantees that a request signal 20 which corresponds to the status of the set control flag in the register 15b is produced for the A/D converter by the timer 1b.

As already explained with reference to FIG. 1, the prioritization logic unit 3 monitors the status of the control flags of the registers 15a–15c for the individual available request sources 1a–1c and carries out the aforementioned prioritization or arbitration if at least one flag 15a–15c of a request source 1a–1c is set. If the timer 1b has a control flag set in the register 15b, the prioritization logic unit 3 accordingly takes into account the request for the A/D converter 5 produced by the timer 1b, and, if there is no request from a higher-priority request source at the same time, the request from the timer 1b is selected by the prioritization logic unit. If this is the case, the multiplexer 2 shown in FIG. 1 is used to select the timer 1b as the request source that is to be processed. The channel prioritization logic unit 4, also shown in FIG. 1, is then used to determine the signal channel that is to be converted within the timer 1b. This is done by the control flags contained in the register 17 being monitored and evaluated by the channel prioritization logic unit 4, the channel prioritization logic unit 4 detecting that flag set in the register 17 which has the highest priority, and feeding the corresponding signal channel of the timer 1b to the A/D converter 5 for A/D conversion. After A/D conversion has been instigated for the signal channel selected by the channel prioritization unit 4, that control flag in the register 17 that corresponds to the signal channel is deleted again.

As can be seen in FIG. 4, the prioritization logic unit 3 monitors not only the status of the control register 15b, however, but also, using a further OR circuit 19, the status of the control register 14 already explained with reference to FIG. 2, in which control register 14 the comparator 12 sets the control flag ADxAL when the predetermined threshold $N_s$ is reached and undershot. This causes the timer 1b or the OR circuit 19 to produce a request signal for the A/D converter 5 not only when at least one of the control flags of the register 17 is in use, but rather, in particular, whenever the control flag ADxAL present in the register 14 is set, i.e. the content of the timer register 10 has fallen below the predetermined threshold $N_s$. In this case, the register 14 is used to apply an "artificial" or additional request signal to the OR circuit 19, and this deactivates the influence of the output signal from the OR circuit 18 or the register 15b. As shown in FIG. 3, the control flag ADxAL is set at a defined instant $T_{max}$ before the end of the timer cycle $T_G$. This instant $T_{max}$ depends on the predetermined threshold $N_s$ and should be dimensioned such that the time interval $T_{max}$ is at least as long as the time required by the A/D converter 5 for A/D conversion of a sample. If, for example, the timer 1b is allocated the highest priority for operation of the prioritization logic unit 3 (cf. FIGS. 1 and 4), this is a way of ensuring that, during A/D conversion of the last sample of an analog signal allocated to the timer 1b, a new A/D conversion is not started before the last A/D conversion operation has finished.

As shown in FIG. 3, the influence of the control flag ADxAL shown in FIG. 4 causes "normal" prioritization by means of evaluation of the status of the control register 15b for the timer 1b to take place only if the content of the timer register 10 has not yet reached the threshold $N_s$. In contrast, as soon as the content of the timer register 10 has fallen to or below the threshold $N_s$, the additionally produced signal 21 (which depends on the status of the control flag ADxAL) from the control register 14 is used to intervene artificially in the arbitration or prioritization procedure of the prioritization logic unit 3 and in this way to block the A/D converter 5 for the programmable time interval $T_{max}$ for other, low-priority request sources, and to reserve it for the timer 1b. As soon as an underflow occurs in the timer register 10, the control flag ADxAL is deleted and the timer register 10 is again loaded with the initialization value $N_{max}$, so that "normal" evaluation of the output signal from the OR circuit 18 shown in FIG. 4 or from the control register 15b is again possible for the present without the influence of the control flag ADxAL.

The lower region of the graph shown in FIG. 3 additionally shows the course of the channel conversion assuming that the timer 1b has been selected by the prioritization logic unit 3 as the request source with the highest priority for the A/D converter 5. In this instance, FIG. 3 shows that, during one phase, the aforementioned triggering takes place (timer triggered conversion, TTC) in order to determine the signal channel to be converted or the signal channels to be converted of the timer 1b. Next, over a number of clock cycles, the selected signal channel n=0 . . . 15 of the timer 1b is sampled and converted by the A/D converter 5. In this case, $T_W$ in FIG. 3 denotes the conversion time required by the A/D converter 5 for converting a sample. In addition, the lower region of FIG. 3 shows, in hatching, the period of time during which the A/D converter 5 is reserved for the timer, after conversion of the last sample, by the control flag ADxAL set in the register 14, and during which it is waiting for a new sample from a new signal channel (possibly after a new request source has been selected by the prioritization logic unit 3).

Finally, it will be understood that instead of producing a register 10 which is decremented in steps, as in the above description, it is naturally also possible to modify the configuration such that the timer register 10 is incremented in steps starting from $N_{min}$. It is thereby necessary to define the threshold NS in relation to the maximum register content $N_{max}$ in order to define the time interval $T_{max}$. However, it is technically easier to produce a timer register 10 which is decremented in steps, as in the above explanation.

We claim:

1. A timer for an A/D converter, comprising:
    a request device adapted to produce a first request signal for an A/D converter to perform A/D conversion on an analog signal allocated to the timer during a cyclically repeated, defined time interval;
    said request device further producing a second request signal, from a specific instant before the defined time interval has elapsed and up to an end of the defined time interval $T_G$, the second request signal to be evaluated in combination with the first request signal for A/D conversion by the A/D converter.

2. The timer according to claim 1, wherein the request device comprises a timer register having a content being decremented in steps from a defined initialization value to a defined minimum value during the cyclically repeating, defined time interval, and said request device further comprising a comparator for monitoring a content of said timer register and initiating a generation of the second request signal when the content of said timer register falls below a defined threshold.

3. The timer according to claim 2, wherein the request device comprises a programmable threshold register coupled to said comparator and having a content defining the defined threshold and a defined instant for generating the second request signal.

4. The timer according to claim 2, which comprises a plurality of channels allocated to the timer, said channels each providing an analog signal for the A/D converter, and said request device further comprising a trigger register with control bits allocated to individual said channels, and wherein a trigger pulse is applied to said trigger register if the content of said timer register has reached the defined minimum value, and an application of the trigger pulse setting a defined control bit of said trigger register, whereupon said channel corresponding to the set control bit is selected for A/D conversion by the A/D converter.

5. The timer according to claim 4, wherein said request device further comprises an OR circuit having an input receiving the states of the control bits of said trigger register and an output outputting the first starting signal.

6. The timer according to claim 5, wherein said request device further comprises a further register wherein said comparator sets a control bit determining a state of the second request signal, and a further OR circuit having an input receiving a state of the control bit, driven by said comparator, of said further register and the first request signal, and an output outputting a signal to be evaluated for A/D conversion by the A/D converter.

7. The timer according to claim 2, wherein said request device further comprises a further register wherein said comparator sets a control bit determining a state of the second request signal, and an OR circuit having an input receiving a state of the control bit, driven by said comparator, of said further register and the first request signal, and an output outputting a signal to be evaluated for A/D conversion by the A/D converter.

8. The timer according to claim 6, wherein said request device further comprises initialization means for reloading said timer register with the defined initialization value and deleting the control bit, set by said comparator, of said further register if the content of said timer register has fallen to the defined minimum value.

9. The timer according to claim 8, which further comprises control means connected to said output of said further OR circuit, and wherein said timer is one of a plurality of requesting devices for the A/D converter, said requesting devices producing request signals for A/D conversion of an analog signal allocated to the respective said requesting device, and wherein said further OR circuit outputs an output signal to said control means and said control means, depending on the request signals from the individual requesting devices, selects a respective said requesting device for A/D conversion by the A/D converter.

10. The timer according to claim 6, which further comprises control means connected to said output of said further OR circuit, and wherein said timer is one of a plurality of requesting devices for the A/D converter, said requesting devices producing request signals for A/D conversion of an analog signal allocated to the respective said requesting device, and wherein said further OR circuit outputs an output signal to said control means and said control means, depending on the request signals from the individual requesting devices, selects a respective said requesting device for A/D conversion by the A/D converter.

11. The timer according to claim 9, wherein each said requesting device is allocated a defined priority, and said control means, when request signals from different requesting devices are simultaneously present, selecting a requesting device for A/D conversion by the A/D converter with a highest priority.

12. The timer according to claim 11, wherein said timer is allocated the highest priority.

* * * * *